United States Patent [19]

Menigaux et al.

[11] Patent Number: 4,720,468

[45] Date of Patent: Jan. 19, 1988

[54] PROCESS FOR THE PRODUCTION OF A MONOLITHIC INTEGRATED OPTICAL DEVICE INCORPORATING A SEMICONDUCTOR LASER AND DEVICE OBTAINED BY THIS PROCESS

[76] Inventors: Louis Menigaux, 85 Avenue des Tilleuls, 91440 Bures-sur-Yvette; Alain Carenco, 4 Rue Paul-Henry Thilloy, 92340 Bourg-la-Reine; Pierre Sansonetti, 61 Chemin de la Valleè aux Wryn, 92290 Chatenay Malabry, all of France

[21] Appl. No.: 800,601

[22] PCT Filed: Mar. 29, 1985

[86] PCT No.: PCT/FR85/00067

§ 371 Date: Nov. 13, 1985

§ 102(e) Date: Nov. 13, 1985

[87] PCT Pub. No.: WO85/04491

PCT Pub. Date: Oct. 10, 1985

[30] Foreign Application Priority Data

Mar. 30, 1984 [FR] France .................. 84 05053

[51] Int. Cl.⁴ .................................. H01L 21/306
[52] U.S. Cl. .................. 437/129; 148/DIG. 95; 357/19; 372/50
[58] Field of Search ............ 29/569 L; 148/DIG. 95; 357/18, 19

[56] References Cited

U.S. PATENT DOCUMENTS 4,296,387 10/1981 Sugino et al. .................. 29/569 L
4,547,956 10/1985 Bouadma et al. ............... 29/569 L

FOREIGN PATENT DOCUMENTS 59-90981 5/1984 Japan .
1539028 1/1979 United Kingdom .

OTHER PUBLICATIONS

Burnham, Xerox Disclosure Journal, vol. 4, No. 3 (Jun., 1979), pp. 355-356.

*Primary Examiner*—O. Chaudhuri
*Attorney, Agent, or Firm*—Oblon, Fisher, Spivak, McClelland, & Maier

[57] ABSTRACT

Process for the production of a monolithic integrated optical device incorporating a semiconductor laser and an optical waveguide, as well as to a device obtained by this process.

The substrate is given a profile having at least one step. On said substrate is deposited by a single epitaxy operation performed in the vapour phase and in a successive manner a first confinement layer, a guidance layer made from a material transparent for the radiation emitted by the laser, a second confinement layer, an active layer, a third confinement layer and a contact layer. The transparent material has a refractive index higher than the indices of the confinement layers surrounding the same. Thickness values are given to the different layers such that the active layer of the lower stack faces the transparent layer of the upper stack.

Application to optical telecommunications.

4 Claims, 7 Drawing Figures

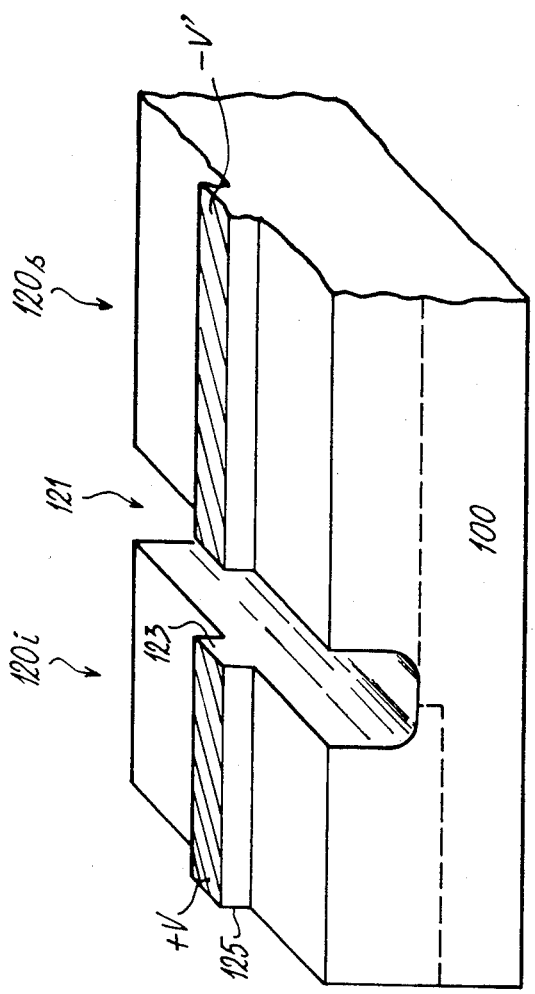

PROCESS FOR THE PRODUCTION OF A MONOLITHIC INTEGRATED OPTICAL DEVICE INCORPORATING A SEMICONDUCTOR LASER AND DEVICE OBTAINED BY THIS PROCESS

BACKGROUND OF THE INVENTION

The present invention relates to a process for producing an "optical circuit". In a general manner, this term refers to a device having semiconductor layers able to produce an amplifier medium, a means for producing an optical resonator, a means for extracting the stimulated optical radiation from the amplifier medium and guide it towards the outside and various other components, such as photodetectors or electrooptical modulators. Such devices are used in optical telecommunications.

The invention aims at obtaining such a circuit in a monolithic integrated version, i.e. which calls on a common technology for producing the various components and does not involve the assembly of various separately produced components.

One of the difficulties caused by the monolithic integration of a semiconductor laser is the production of the resonator which, combined with the active layer forming the amplifier medium, makes it possible to obtain a coherent light radiation. Several solutions have been adopted in the prior art, such as producing two mirrors by ionic or chemical working or machining, the use of periodic structures of the diffractive grating type, placed outside the active layer or distributed therein, etc.

Another problem caused by monolithic integration is the necessity of having a transparent layer, which can serve as an optical guide to the radiation emitted by the active layer. The coupling between the active layer and the optical guide leads to a redefinition of the laser structure.

The attached FIGS. 1 to 4 give further details on these problems. They describe several known structures offering different solutions for these problems.

The laser shown in FIG. 1 comprises a substrate 10, a first confinement layer 11, an active layer 12, a second confinement layer 13, a contact layer 14, a metal layer 15 forming the first ohmic contact and a metal layer 16 positioned beneath the substrate and forming the second ohmic contact. A transparent insulating layer 17 covers the edges of the structure. An optical waveguide 18 is placed on either side of the laser. The composition and thickness of the main layers can e.g. be as follows:

| | | |
|---|---|---|
| 15 | Cr—Au | |
| 14 | $p^+$GaAs | 1 $\mu$m |
| 13 | $p^+$Al$_{0.3}$Ga$_{0.7}$As | 2 $\mu$m |
| 12 | $p^+$GaAs—Si | 1 $\mu$m |
| 11 | $n^+$Al$_{0.3}$Ga$_{0.7}$As | 2.5 $\mu$m |
| 10 | $n^+$GaAs | |
| 16 | Au—Sn | |
| 17 | SiO$_2$ | |
| 18 | $n^-$GaAs | 12 $\mu$m |

This known structure is described in the article by C. E. Hurwitz et al entitled "Integrated GaAs-AlGaAs double-heterostructure lasers", published in Applied Physics letters, vol. 27, no. 4, 15.8.1975, pp. 241/3.

The structure shown in FIG. 2 also comprises an optical waveguide coupled to the active layer, but which is arranged in the manner of so-called "Integrated Twin-Guide Lasers with Distributed Bragg Reflector" or in abbreviated form "DBR-ITG Lasers".

As shown the laser comprises a type n InP substrate 30, a layer 28 of Ga$_u$In$_{1-u}$As$_v$P$_{1-v}$ (u and v<1), a type n InP confinement layer 26, an active layer 31 of Ga$_x$In$_{1-x}$As$_y$P$_{1-y}$ (x and y<1), a type p GaInAsP layer 32, a type p InP layer 35, a GaInAsP contact layer 36 and finally a gold layer 40. The diffractive grating is formed on the separating layer 26. The electrical insulation is provided by the SiO$_2$ layer 24.

Such a structure is more particularly described in the article by K. Utaka et al entitled "1.5–1.6 $\mu$m GaInAsP-/InP Integrated Twin-Guide Lasers with First Order Distributed Bragg Reflectors" published in Electronics Letters, 5.6.1980, . vol. 16, no. 12.

The refractive index of the layers is shown in the left-hand part of the drawing. It can be seen that the index of layer 28 is higher than the indices of the adjacent layers 26 and 30, which is favourable for the guidance of the radiation in layer 28.

As is also known the diffraction grating of the laser can be distributed along the amplifier medium instead of being placed at each of its ends, which leads to a distributed feedback or DFB laser.

Such a device is shown in FIG. 3. It comprises a type n GaAs substrate 70, a type n Ga$_{0.7}$Al$_{0.3}$As layer 72, a type p GaAs active layer 74, a type p Ga$_{0.8}$Al$_{0.2}$As layer 76 surmounted by a type p Ga$_{0.93}$Al$_{0.07}$As layer 78 where the distributed grating is formed, a type p Ga$_{0.7}$Al$_{0.3}$As layer 80, a Ga$_{0.9}$Al$_{0.1}$As layer 81 type p-doped by Zn diffusion above the active layer and a conductive layer 83. Radiation is removed by a waveguide incorporating a type p Ga$_{0.7}$Al$_{0.3}$As layer 82 surmounted by a Ga$_{0.9}$Al$_{0.1}$As layer 84, which is not doped outside the active layer of the laser.

Such a structure is described by K. Aiki et al in an article entitled "A Frequency Multiplexing Light Source with Monolithically Integrated Distributed-Feedback Diode Lasers", published in IEEE Journal of Quantum Electronics, vol. QE-13, no. 4, April 1977. pp. 220–223.

Finally, FIG. 4 shows an integrated optical device incorporating a laser 90 and a photodetector 92, each of these components essentially having an identical active layer, respectively 91 and 93. These layers are optically coupled to an optical guide 94, in accordance with the principles described hereinbefore. Such a structure is described in the article by J. L. Merz et al entitled "GaAs Integrated Optical Circuits by Wet Chemical Etching", published in IEEE Journal of Quantum Electronics, vol. QE-15, no. 2, February 1979, pp. 72–82.

All these methods suffer from disadvantages, either in that they lead to a mediocre coupling between the active layer and the optical guide (variants of FIGS. 2 and 4) or in that they require several epitaxy operations (variants of FIGS. 1 and 3).

SUMMARY OF THE INVENTION

The present invention aims at obviating these disadvantages. To this end, it proposes a production process only requiring a single epitaxy operation and which leads to an excellent coupling between the active layer and the layer serving as an optical guide.

The present invention specifically relates to a process for the production of a monolithic integrated optical device incorporating at least one semiconductor laser and an optical waveguide by stacking semiconductor layers by epitaxy on a substrate, wherein it comprises the following operations:

the substrate is given a profile having at least one step of height (h) between two different height levels, namely a lower level and a higher level;

on said substrate is deposited by a single vapour phase epitaxy operation and in a successive manner a first confinement layer, a guidance layer made from a material transparent for the radiation emitted by the laser, a second confinement layer, an active layer, a third confinement layer and a contact layer;

the transparent material is chosen in such a way that its refractive index is higher than the indices of the confinement layers surrounding it;

thickness values are given to the transparent layer, the second confinement layer and the active layer such that the distance (d) separating the median planes of the active layer and the transparent layer is equal to the height (h) of the substrate step, the active layer of the lower stack deposited on the lower level of the substrate than being located at the same level as the transparent layer of the upper stack deposited on the upper level of the substrate, the lower level constituting a laser emitting radiation in the plane of the active layer, said radiation penetrating into and being guided by the transparent layer of the upper stack serving as an optical guide.

This process can have several variants as a function of the type of resonator used (machined mirrors, diffraction gratings outside the active layer) or as a function of the final structure to be obtained (laser associated with a photodetector, etc.), in accordance with considerations referred to hereinbefore in connection with the prior art.

The present invention also relates to a device obtained by the process defined hereinbefore and wherein it comprises:

a substrate having a profile with at least one step of height (h) between two different height levels, namely a lower level and an upper level;

on said substrate are successively deposited a first confinement layer, a guidance layer made from a material transparent to the radiation emitted by the laser, a second confinement layer, an active layer, a third confinement layer and a contact layer;

the transparent material having a refractive index higher than the indices of the confinement layers surrounding it;

the thickness of the transparent layer, the second confinement layer and the active layer having values such that the distance (d) separating the median planes of the active layer and the transparent layer is equal to the height (h) of the substrate step, the active layer of the lower stack deposited on the lower level of the substrate then being at the same level as the transparent layer of the upper stack deposited on the upper level of the substrate;

the lower stack of said device constituting a laser emitting radiation in the plane of the active layer, said radiation penetrating into and being guided by the transparent layer of the upper stack serving as an optical guide.

BRIEF DESCRIPTION OF THE DRAWINGS

The invention is described in greater detail hereinafter relative to non-limitative embodiments and with reference to the attached drawings, wherein show:

FIG. 7 Another embodiment in the case of a structure with laser and photodetector or electrooptical modulator.

DETAILED DESCRIPTION OF THE PREFERRED EMBODIMENTS

The basic idea of the invention is to make use of the double fact that growth by vapour phase epitaxy (organometallic or by molecular jet) on a substrate generally strictly follows the profile of the substrate and the transition zone between two different height levels is not disturbed in its composition.

These properties of vapour phase epitaxy are used in the invention for bringing about a displacement in the order of the layers deposited on the two substrate steps and for permitting the direct injection of light from one of the layers into another.

For this purpose, the step height must be chosen in such a way that the active zone of the layer faces a transparent layer. In order that the latter has a guidance function, it is sufficient for it to be surrounded by two layers with a lower index. For example, if the layer in question is of $Al_xGa_{1-x}As$, the adjacent layers will be of $Al_yGa_{1-y}As$ with $y > x$.

The thicknesses and compositions of the layers are chosen as a function of the properties sought for the circuit. Every effort will be made to ensure that there is no transfer of light by evanescent wave from the active layer to the adjacent layers (effect used in directional couplers).

Figure 5:
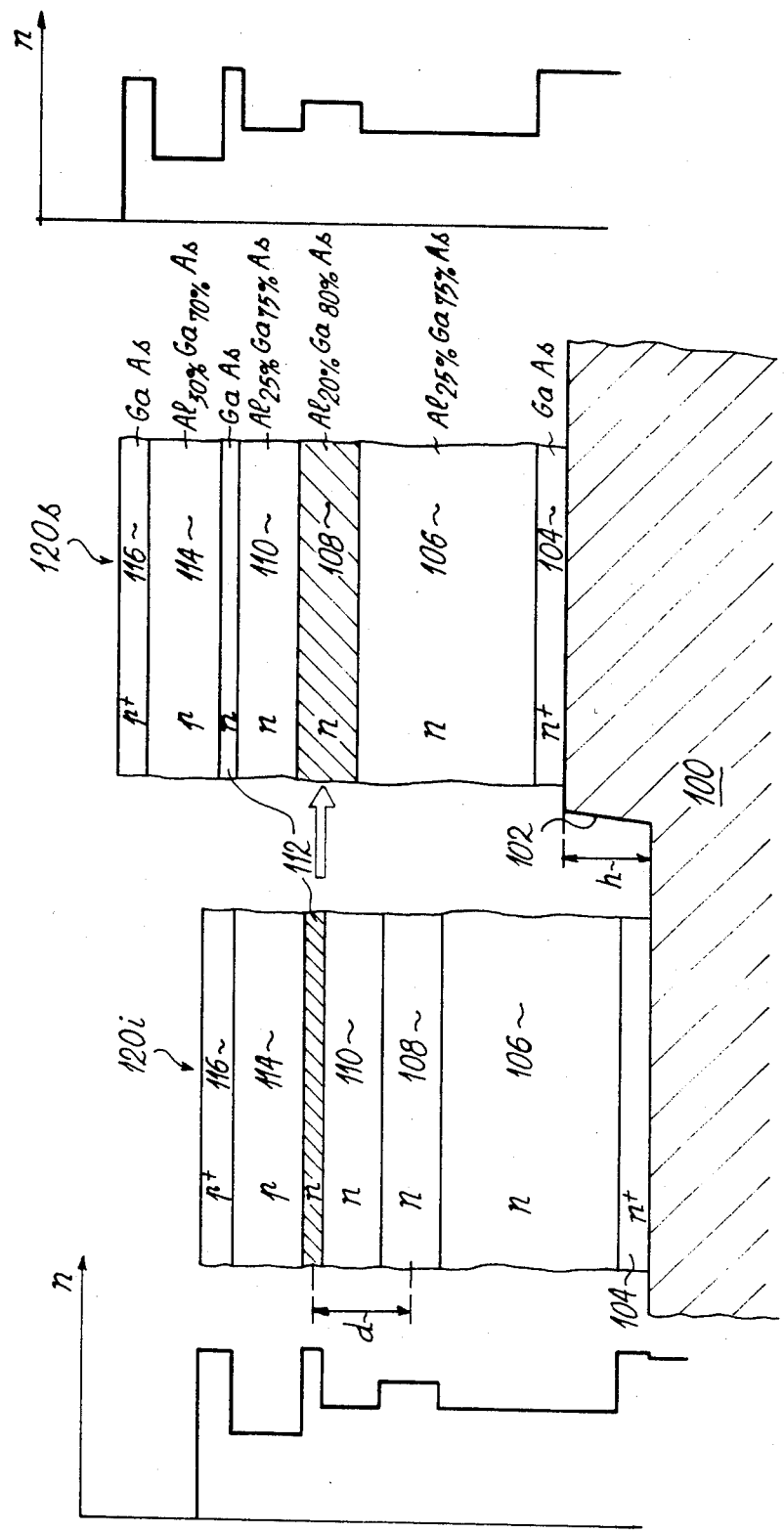
FIG. 5 In section, a general structure illustrating the process of the invention.

FIG. 5 illustrates the process according to the invention in its general concept. On an e.g. GaAs semi-insulating substrate 100, oriented (001), a step 102 of height h (e.g. 1.5 $\mu$m) is produced by chemical or ionic machining. This step is parallel to one of the cleavage planes, e.g. parallel to direction (110). Semiconductor layers are than deposited by vapour phase epitaxy, namely a first type n+ GaAs conductive layer 104 of thickness 0.5 $\mu$m, which serves as a common contact for the circuit and which is necessary because the substrate is semi-insulating; a 3 $\mu$m type n $Al_{0.25}Ga_{0.75}As$ layer 106 acting as an optical confinement for the guide; a 1 $\mu$m type n $Al_{0.20}Ga_{0.80}As$ layer 108 acting as a guide; a 1 $\mu$m type n $Al_{0.25}Ga_{0.75}As$ layer 110 acting as an optical confinement both for the preceding layer and for the following layer; a 0.2 $\mu$m GaAs layer 112 acting as an active layer for the laser; a 1.3 $\mu$m type p $Al_{0.30}Ga_{0.70}As$ layer 114 acting as a confinement for the active layer; and finally a 0.5 $\mu$m type p+ GaAs contact layer 116.

This leads to two stacks of semiconductor layers, namely a lower stack 120i deposited on the lower substrate level (left-hand part of FIG. 5) and an upper stack 120s deposited on the upper substrate level (righ-hand part). These two stacks have the same compositions, but the levels of the different layers are displaced by a height h.

Layers 108, 110 and 112 have a thickness such that the distance d between the median planes of layers 108 and 112 is equal to the height h of step 102. Thus, layer 112 of the lower stack 120i faces layer 108 of the upper stack 120s.

Figure 6:
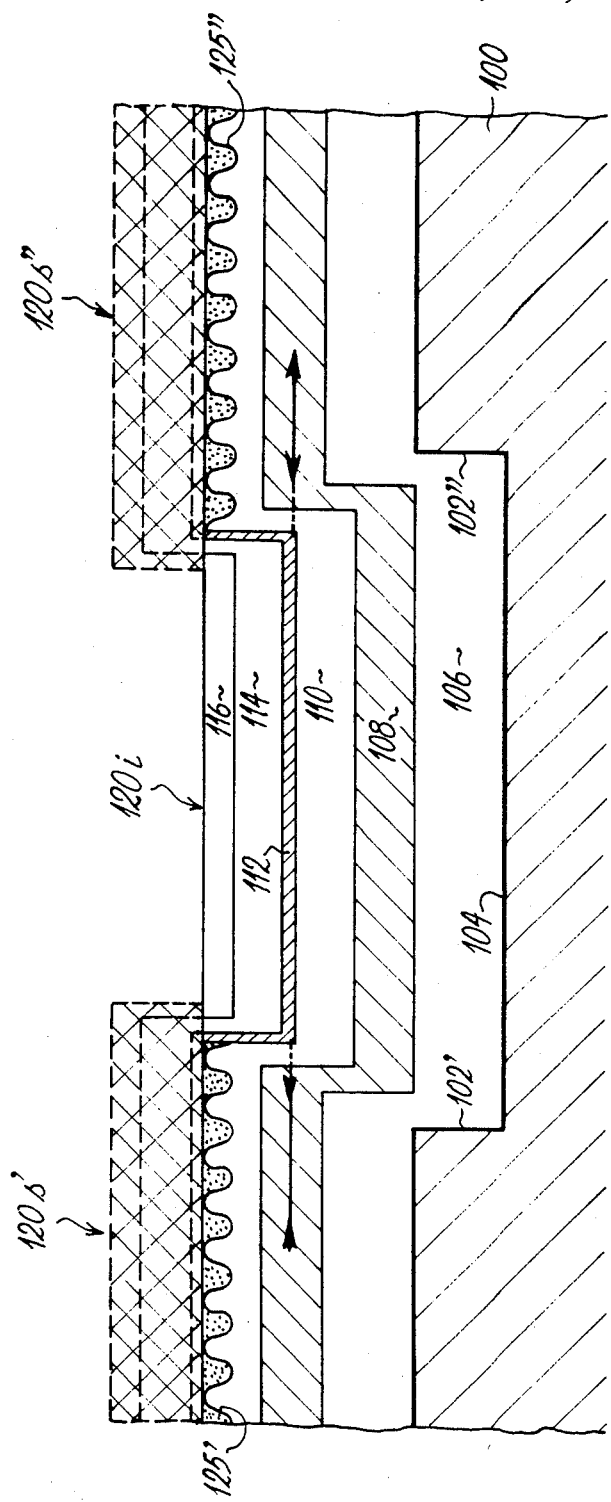
FIG. 6 An embodiment of the process according to the invention in the case of a structure, whose reflectors are gratings.

In FIG. 5, the part which is inserted between the two stacks 120i and 120s is not clearly shown, because it is dependent on the desired final structure. FIG. 6 shows a case where the layers are continuous and are mutually joined by a highly inclined zone adopting the shape of the substrate step. FIG. 7 shows another example, in which the two stacks are separated by a channel.

To return to FIG. 5, it is clear that for certain applications layers 112, 114 and 116 of upper step 120s are not useful and that they can then be eliminated by etching. The device can then have a planar upper face, if the thicknesses of layers 114 and 116 have been appropriately chosen.

It is also appropriate to treat the assembly and particularly the lower step 120i by conventional operations for obtaining semiconductor lasers, e.g. proton bombardment for defining an active strip and deposition of a metal layer forming an ohmic contact on layer 116.

On the left and right-hand parts of FIG. 5 are also shown the variations in the refractive index of the different layers. It can be seen that layer 108 used as a guide in the right-hand part of the structure has a higher index than that of the adjacent layers 106 and 110.

FIG. 6 shows a variant in which the substrate 100 has two steps 102', 102", i.e. two upper levels 120's and 122"s surrounding a lower level 120i. According to this embodiment, layer 110 is subject to an appropriate treatment able to give its guidance properties a periodic modulation (125', 125") making it possible to form Bragg reflectors. The structure obtained is finally a DBR laser with a central emissive part (active layer 112) and two reflecting parts (120's, 120"s) forming a resonator.

The abrupt interfaces induced by the step between the central stack 120i and the two upper stacks 120's and 122"s make it possible to obtain direct light transfer from the active layer 112 to the two guides, without it being necessary to machine mirrors between the central part 120i and the extreme parts 120's and 120"s.

Figure 1:
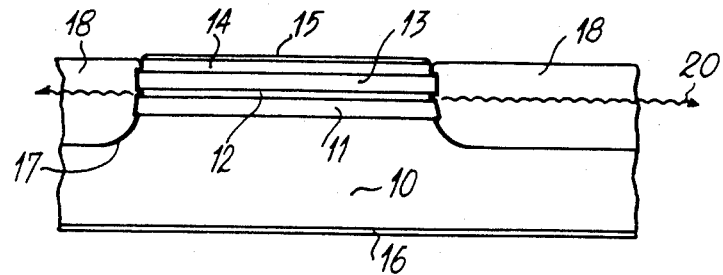
FIG. 1 Already described, diagrammatically a laser with machined faces with an output optical guide.
Figure 2:
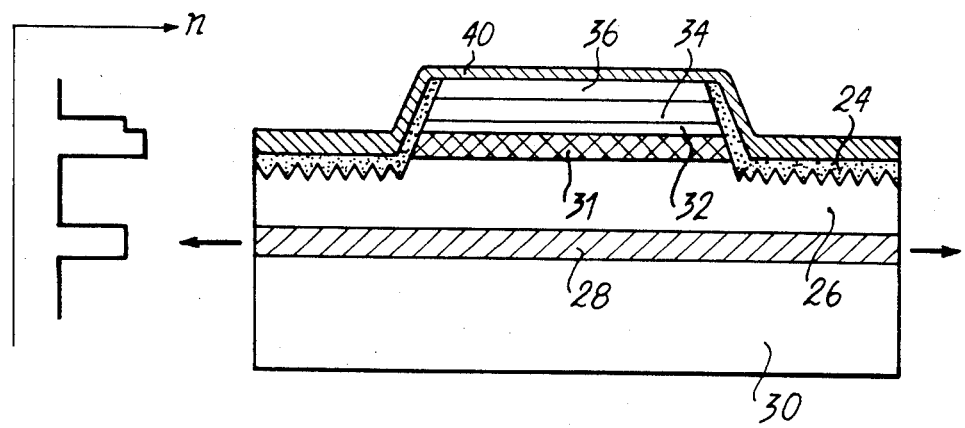
FIG. 2 Already described, a laser with diffraction gratings located outside the active layer and positioned above a coupling optical guide.
Figure 3:
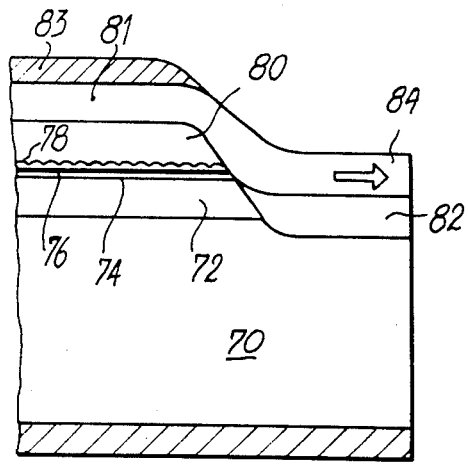
FIG. 3 Already described, a distributed reaction laser with an output guide.
Figure 4:
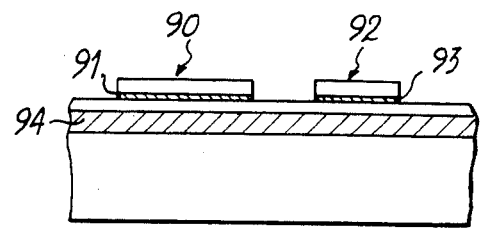
FIG. 4 Already described, an integrated device with laser and photodetector coupled by a waveguide.

With the process according to the invention, it is naturally also possible to obtain a distributed negative feedback structure (DBR laser) in accordance with the principles referred to relative to FIG. 3.

Finally, FIG. 7 shows a variant in which the intermediate part between the two stacks is machined by conventional etching procedures, so as to produce a channel 121. This leads to the appearance of a mirror 123, another mirror 125 being obtained by cleaving. This leads to a laser with two mirrors, one machined and the other cleaved, said laser emitting into an external light guide.

It is possible with the device according to FIG. 7, if the need arises, to act by the electrooptical effect on the light leaving the guide by reverse biasing of a Schottky diode or a p-n junction (provided that all or part of the type p epitactic layer has been retained during the levelling of the two parts of the device).

It is now clear that the major interest of the process according to the invention is based on the possibility of operating with a single epitaxy operation. In order to obtain devices similar to those described, it would still be possible to proceed in several stages, e.g. by firstly depositing on one side of a substrate a guidance structure and then depositing on the other side thereof an amplification structure (which also leads to a major problem in the alignment of two subassemblies), then forming layers covering the assembly and ensuring the lateral confinement thereof. However, such a procedure would require three epitaxy operations. According to the invention, a single epitaxy operation is required, the alignment between the active layer and the guide being obtained automatically.

What is claimed is:

1. A process for the production of a planar monolithic integrated optical device incorporating at least one semiconductor laser and an optical waveguide by stacking semiconductor layers by epitaxy on a substrate, wherein it comprises the following operations:

the substrate is given a profile having at least one step of height (h) between two different height levels, namely a lower level and an upper level;

on said substrate is deposited by a single vapour phase epixtaxy operation and in a successive manner a first confinement layer, a guidance layer made from a material transparent for the radiation emitted by the laser, a second confinement layer, an active layer, a third confinement layer and a contact layer, to form a lower stack on said lower level and an upper stack on said upper level;

the transparent material is chosen in such a way that its refractive index is higher than the indices of the confinement layers surrounding it;

thickness values are given to the transparent guidance layer, the second confinement layer and the active layer such that the distance (d) separating the median planes of the active layer and the transparent guidance layer is equal to the height (h) of the substrate step, thereby the active layer of the lower stack is located at the same level as the transparent guidance layer of the upper stack, the lower stack constituting a laser emitting radiation in the plane of the active layer, said radiation penetrating into and being guided by the transparent guidance layer of the upper stack serving as an optical guide;

etching said third confinement layer and said contact layer of the upper stack, thereby leading to a planar upper face.

2. A process according to claim 1, wherein before depositing the first confinement layer, a contact conducting layer is deposited on the semi-insulating substrate.

3. A process according to claim 1, further comprising the step of etching a channel between the lower stack and the upper stack, thereby leading to an etched mirror on a side of said lower stack and the step of cleaving the lower stack forming a cleaved mirror on another side of said lower stack.

4. A process according to claim 1, wherein a distributed diffraction grating structure is given to the second confinement layer located on the transparent guidance layer of the upper stack.

* * * * *